United States Patent [19]
Lowrey et al.

[11] Patent Number: 5,208,125
[45] Date of Patent: May 4, 1993

[54] PHASE SHIFTING RETICLE FABRICATION USING ION IMPLANTATION

[75] Inventors: Tyler A. Lowrey; Randal W. Chance, both of Boise, Id.

[73] Assignee: Micron Technology, Inc., Boise, Id.

[21] Appl. No.: 738,063

[22] Filed: Jul. 30, 1991

[51] Int. Cl.$^5$ ............................................. G03F 9/00
[52] U.S. Cl. ................................... 430/5; 430/22; 430/311; 430/396
[58] Field of Search ................. 430/5, 22, 269, 311, 430/396

[56] References Cited

U.S. PATENT DOCUMENTS 4,686,162  8/1987  Stangl et al. .......................... 430/5
5,045,417  9/1991  Okamoto ............................... 430/5

OTHER PUBLICATIONS

Nitayama et al. "New Phase Shifting Mask with Self-Aligned Phase Shifters for a Quarter Micron Photolithography" pp. 3.3.1–3.3.4.
Fujitzu "SiO$_2$ Sputter and Lift-Off".
Isamu Hanyu et al. "New Phase-Shifting Mask with Highly Transparent SiO$_2$ Phase Shifters" pp. 167–177.

Primary Examiner—Marion E. McCamish
Assistant Examiner—S. Rosasco
Attorney, Agent, or Firm—Angus C. Fox, III

[57] ABSTRACT

A method of fabricating a phase shifting reticle that can be used as a mask in photolithographic processes such as semiconductor wafer patterning. A transparent quartz substrate is subjected to high voltage ion bombardment to produce patterns of ion implant areas on the substrate. By carefully selecting the dopants for ion implantation and closely controlling the implantation process, areas on the substrate are produced having an absorption property for forming an opaque light blocking area or indexes of refraction different than the quartz substrate and selected to achieve a 0° to 180° phase shift area. This produces a repetitive pattern of alternating light transmission openings and phase shifters having opaque light blockers on either side. Additionally, tapered phase shifters may be implanted into the substrate to extend from a 180° phase shift area into a light transmission opening at a 0° phase shift.

20 Claims, 5 Drawing Sheets

PHASE SHIFTING RETICLE FABRICATION USING ION IMPLANTATION

FIELD OF THE INVENTION

This invention relates to a novel process particularly suited to fabricating phase shifting reticles or masks that can be used in fine line photolithography such as used in semiconductor manufacture.

BACKGROUND OF THE INVENTION

As semiconductor manufacturing advances from very large scale integration (VLSI) to ultra-large scale integration (ULSI), the devices on semiconductor wafers shrink to sub-micron dimension and the circuit density increases to several million transistors per die. In order to accomplish this high device packing density, smaller and smaller feature sizes are required. This may include the width and spacing of interconnecting lines in the service geometry such as corners and edges, of various features.

The requirement of small feature sizes with close spacing between adjacent features requires high resolution photolithographic processes. In general, photolithography utilizes a beam of light, such as ultra violet (UV) waves, to transfer a pattern from a photolithographic mask to a photo resist coating through an imaging lens. The mask includes opaque and transparent regions such that the shapes match those openings in the resist coating in the desired or predetermined pattern.

Early prior art masks, and referring now to FIG. 1A-1D, were made by coating a quartz blank 10 with a chrome 12 or other light blocking material layer upon which was laid a coating of photoresist material 16. An electron beam 15 used to write the desired pattern on the photoresist coating 16 after which the photoresist is developed. Next, and referring to FIG. 1C, a chrome etch is performed on the exposed regions, after which the resist is stripped. As shown in FIG. 1D, a reticle having transparent openings 14 and opaque area 12 has been formed on the quartz blank 10. Unfortunately, reticles thus formed are limited in resolution capability due to the effects of diffraction.

One technique currently being investigated for improving the resolution of the photolithographic process is known as phase shift lithography. With phase shift lithography, the interference of light rays is used to overcome diffraction and improve the resolution and depth of optical images projected on to a target. In phase shift lithography, the phase of an exposure light at the object is controlled such that adjacent bright areas are formed preferably 180° out of phase with one another. Dark regions are thus produced between the bright areas by disruptive interference even when diffraction would otherwise cause these areas to be lit. This technique improves total resolution at the object, providing a line/space resolution 50% to 70% greater than that possible using conventional transmission means.

An early patent in this field, U.S. Pat. No. 4,360,586 to Flanders et al, is directed to exposing periodic optical features on an object surface. The features were characterized by a spacial period "p". According to the invention, a source of radiant energy of wavelength illuminates a surface to be exposed through a mask having a spatial period separated from the surface by a distance approximately $S_n = P^2/\lambda$, where n is an integer greater than 1.

With respect to semiconductor fabrication numerous laboratory techniques have been proposed to employ phase shifting in the photo patterning of semiconductor wafers. Most of the work in this area has centered around either "Alternating Phase Shifting", "Subresolution Phase Shifting", or "Rim Phase Shifting" experiments. In general, in each of these techniques a phase shift mask or reticle is constructed in repetitive patterns in three distinct layers of material. An opaque layer on the mask provides areas that allow no light transmission therethrough, a transparent layer provides areas which allow close to 100 percent of light to pass through and a phase shift layer provides areas which allow close to 100 percent of light to pass through, but phase shifted 180° from the light passing through the transparent areas. The transparent areas and phase shifting areas are situated so that light rays defracted through each area is cancelled out in a darkened area there between. This creates the pattern of dark and bright areas which can be used to clearly delineate features of a pattern on a photopattern wafer.

"Alternating Phase Shifting" is a spatial frequency reduction concept similar to the method disclosed in the Flanders et al patent. It is characterized by a pattern of features alternately covered by a phase shifting layer. "Subresolution Phase Shifting" promotes edge intensity cut off by placing a subresolution feature adjacent to a primary image and covering it with a phase shifting layer. "Rim Phase Shifting" overhangs a phase shifter over a chrome mask pattern.

In general, these phase shifting techniques have not been adapted to large scale semiconductor manufacturing processes. One problem with applying phase shifting lithography into practical use, in manufacturing semiconductors, is the difficulty in reticle mask making, inspection, and repair. The process must be compatible with the manufacturing conditions, (ie. inexpensive, repetitive, clean) and prior art laboratory techniques have not heretofore met these criterion.

A representative state of the art semiconductor laboratory process for making a phase shift mask or reticle is the process generally disclosed in the Flanders et al patent. This process is shown in FIGS. 2A-2D and can be termed a "lift-off or additive process".

The "lift-off process" may be used to fabricate a reticle or hard copy of an individual drawing for a semiconductor circuit layout. The reticle may then be used directly as a mask in the photopatterning process or may be used to produce a photomask. As an example, the reticle may be used to pattern a wafer surface in a stepped pattern transfer. DRAMs and SRAMs because of their repetitive nature are adapted to manufacture in this manner.

Still referring now to FIG. 1D, with the lift-off process, a transparent quartz substrate 10 has a film of an opaque material 12 such as chromium (CR) pattern thereon. The chromium 12 may be deposited and patterned onto the substrate 10 by a conventional process such as electron beam lithography. In the example of FIG. 1D, the pattern is a periodic arrangement of chrome 12 and spaces 14 patterned on the quartz substrate 10.

Referring now to FIG. 2A, a thin film layer of phase shifter material such as (SiO₂) is deposited over the pattern chrome 12 and spaces 14. The phase shift material is selected from those with suitable optical properties and is deposited with a thickness equivalent to a half wavelength (λ/2) at the exposure source of interest. Thus, the phase shift ultimately obtained as a function of the thickness "t" and refractive index of the phase shifter material, which are preferably selected to provide a 180° phase shift.

Next, the phase shift material is coated with a resist 20 sensitive to electron beam exposure. The desired phase shift pattern is then written onto the resist 20 and the resist pattern thus obtained is developed and removed. Next, the phase shift film 18 is etched in the regions where the resist was removed. Following this step, the resist is then stripped, leaving a phase shifter 18 in every other opening 14 between the chrome 12. This provides an alternating phase shifting pattern as previously explained.

Problems with this "lift-off process" are that it is defect prone, inconsistent, a less manufacturable procedure and, thus, not as suitable for large scale manufacturing. Deposition of the phase shifter material is prone to particulate contamination. These contaminants may cause subsequent patterning errors of the finished wafer. Another problem with the "lift-off process" is that it is difficult to accurately control the thickness of phase shifter 18 uniformally across the quartz plate 10. A still further problem is the lack of an etch stop between the phase shifter film and the quartz substrate (particularly when $SiO_2$ is used for both). A uniform timed etch accurate across the whole of the quartz plate is difficult to achieve.

In the finished reticle, each phase shifter 18 preferably has a thickness "t" (FIG. 2C) that produces a 180° phase shift for light passing there through. This optimal thickness can be determined by the formula:

$$t = \frac{i\lambda}{2(n-1)}$$

where t = thickness of phase shift material
i = an odd integer
λ = equals wavelength of exposure light
n = refractive index of phase shifter material of the exposure wavelength Any deviation from this optimal thickness adversely effects the phase shift ultimately obtained. An "edge effect" may occur, for example, at the edge of a phase shifter 18 deposited over the edge of a chrome light blocker 12. This may be due to the conformal deposition of the phase shifter material 18 over the chrome light blocker 12 which causes the phase shifter 18 to be slightly thicker at the edges.

Another prior art method for forming a phase shift reticle is shown in FIGS. 3A–3C. As before, a pattern of opaque light blockers 12 such as chromium (CR) is formed on a quartz substrate 10. As shown in FIG. 3A, photoresist 20 is then pattern on the chrome light blockers 12 in every other opening 14. As shown in FIG. 3B, openings 14 not covered with photoresist are then etched to form phase shifter openings 22 etched back to a depth "d" into the substrate of the quartz substrate 10. Light passing through an etched back phase shifter opening 22 is phase shifted relative to light passing through an adjacent transmission opening 14 which must travel through the full thickness of the quartz substrate 10.

This prior art reticle fabrication method is also subject to several disadvantages. First, the etch depth "d" into the quartz 10 requires a highly controlled uniform etch over a relatively large (example—5") reticle surface. Since it is necessary to phase shift within a margin of ±10° or less, this translates to an etch tolerance of about 5%. This is difficult to achieve under manufacturing conditions.

Further, the prior art etch back technique shown in FIGS. 3A–3C causes a finite loss in light transmission due to the roughness of the exterior surface of the etch back phase shifter openings 22. Another disadvantage of this etch back technique is the difficult requirement of having to accurately pattern photoresist 20 over the topology of the opaque light blockers 12.

The process of the present invention is directed to a novel process that overcomes these prior art limitations. The process of the invention provides a clean, repetitive technique for forming accurate phase shifting reticles suitable for large scale semiconductor manufacturing. Moreover, the process of the invention can be used to provide phase shifters having a smooth and optically flawless surface.

SUMMARY OF THE INVENTION

In accordance with the present invention, a novel method of fabricating phase shifting reticles or masks for semiconductor photolithography is provided. The method of the invention, simply stated, utilizes ion implantation to change the index of refraction of an area of the transparent substrate to form either light blockers or phase shifters. Each ion implanted light blocker has an absorption characteristic selected to completely block light from passing through the transparent substrate. Further, each ion implanted phase shifter has an index of refraction selected to provide resultant light diffraction 180° out of phase from light defracted through light transmission openings defined on the transparent substrate by the opaque implantations. The opaque light blockers, the phase shifters and the transparent areas formed in the substrate form a repetitive alternating pattern on a finished reticle of light blockers, phase shifters and light transmission openings.

The method of the invention for forming phase shifting reticle in general, includes the steps of:

Forming a pattern of ion implant areas on a transparent quartz substrate in order to change the absorption characteristics of the quartz substrate to form opaque or light blocking areas; and Forming a pattern of ion implant areas on a transparent quartz substrate in order to change the index of refraction of the quartz substrate to form phase shifters in the substrate such that a repetitive alternating pattern is formed having phase shifters, light transmission openings, and opaque areas.

In use as a reticle, during photopatterning of a wafer, incident light is directed through the quartz substrate. Light passing through a phase shifter is transmitted in an opposite (180°) optical phase from light passing through an adjacent light transmission opening. This phase cancelling produces a dark region formed on the target object (wafer), between the phase shifter and the adjacent light transmission opening.

Further, it may be desirable for use with phase shifts other than 180°. The method of the invention permits any desired phase shift angle or multiple combinations of angles.

Numerous other features objects and advantages of the invention will become apparent from the following

DETAILED DESCRIPTION OF THE PREFERRED EMBODIMENT

As used herein, the term reticle and mask are interchangeable. Additionally, the disclosure refers to various materials which are electrically either conductive, insulating, or semiconducting, although the completed semiconductor circuit itself is usually referred to as a "semiconductor".

Figure 5A:
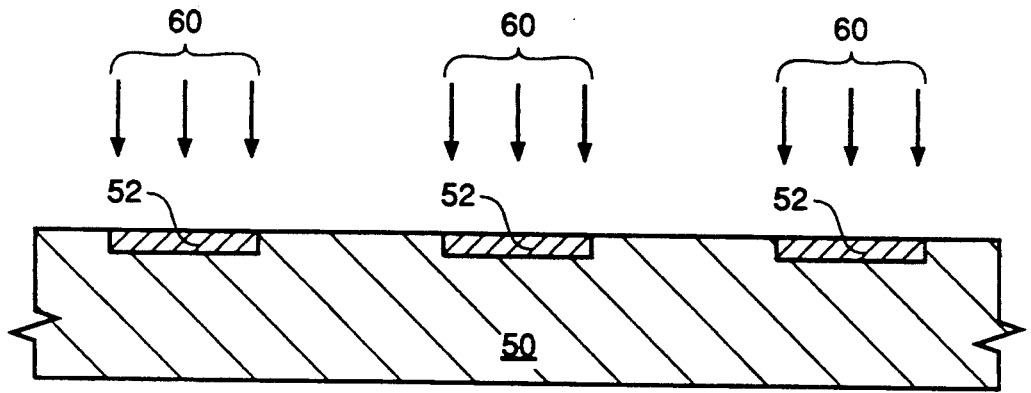
FIGS. 5A and 5B are diagrammatic representations of the steps involved in fabricating a phase shift reticle in accordance with the invention.
Figure 5B:
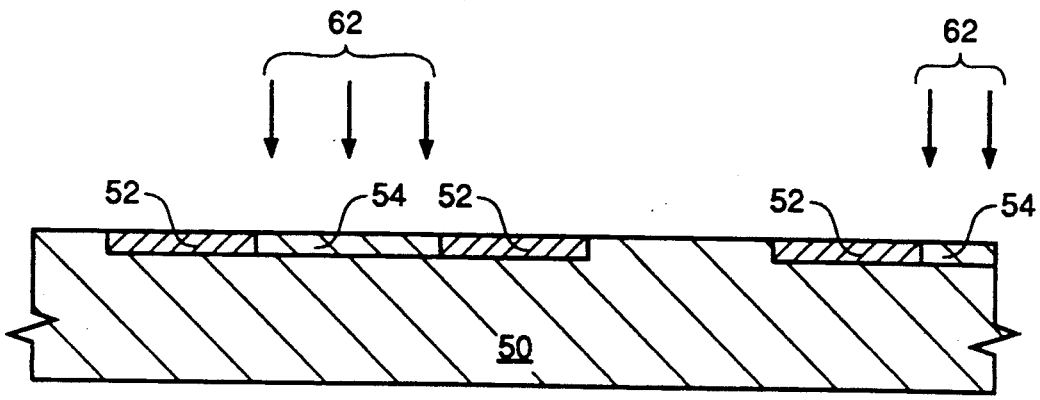

Referring to FIGS. 5A and 5B, a method of fabricating a phase shift reticle in accordance with the invention (is) as shown.

The method of the invention includes the steps of:

Ion implanting in a predetermined pattern areas of the substrate with a dopant in order to change the absorption characteristics of the quartz substrate to form opaque blockers, (FIG. 5A);

Ion implanting areas of the substrate with a dopant in order to change the index of refraction of the quartz substrate to form phase shifters (FIG. 5B).

Referring now to FIG. 5A, a phase shift reticle fabricated in accordance with the invention is formed on a transparent substrate 50. In an illustrative embodiment of the invention, the transparent substrate 50 is quartz (QZ). Quartz is a highly purified glass favored for its optical properties, inherent stability at high temperatures and its cleanliness. Quartz is typically utilized as the mask substrate material and optical projection systems and is highly transparent in the deep UV region. Alternately, the transparent substrate 50 may be formed of any other transparent material having suitable optical and mechanical properties.

As shown in FIG. 5A, the present invention utilizes an ion beam 60 to directly write patterns into the quartz 50. As shown, substrate 50 is subjected to a high voltage ion bombardment 60 with ion dopants selected from a suitable species such as nitrogen, tungsten, or chrome with an optimized dose to render the implanted regions opaque to a preselected wavelength of interest.

Ion implanting process are well known in the art of semiconductor manufacturing. In general, ion implantation forms a specific concentration and distribution of dopant atoms in the quartz substrate 50. This alters the chemical structure and physical characteristics of the substrate 50 in the ion implant area. In the present case, the objective is to provide a dopant concentration and distribution that achieves a change in the absorption property of the quartz substrate 50 to provide opaque regions at the exposure wavelength. The exposure wavelength may, for example, be at a wavelength of about 248 nm for KrF excimer laser lithography. Photolithography may also be preformed in the range of the UV i-line (365 nm) or the UV g-line (436 nm) which are also common wavelengths used in photolithography processes.

The change in the absorption properties may be achieved by closely controlling the ion implantation process by techniques that are known in the art. The implantation may be formed on suitable ion implantation equipment used in the semiconductor manufacturing art such as, by way of example, with an electrostatic beam (E-Beam) scanning apparatus using conventional E-Beam write resist patterning or, alternatively, with direct ion beam write where the ion beam is directed in the desired pattern by means of electrostatic scan, magnetic deflection, mechanical scan or the like. The dopant ions, again may be any suitable ions such as, for example, suitable species including nitrogen, tungsten, or chrome.

Next, and as shown in FIG. 5B, the substrate 50 is again subjected to a high voltage ion bombardment 62 with ion dopants. This forms ion implant areas in the substrate, which, as will be hereinafter explained, function as phase shifters 54. These ion implant areas (phase shifters 54) are characterized by an index of refraction that is different than the index of refraction of the remaining transparent quartz substrate 50. Preferably, this relative difference in the index of refraction provides a phase shift of 180° between light passing through a phase shifter 54 and light passing through transparent portions of the transparent quartz substrate 50.

Again, the implantation may be preformed on suitable ion implantation equipment used in the semiconductor manufacturing art such as was above described for implantation of the opaque regions 52. A dopant ion may be any suitable ions such as for example, selected from a species including boron and phosphorous.

Through use of the present invention, the smooth surface of the quartz substrate 50 shown in FIG. 5B is not degraded by the process such that the surface and optical properties of the opaque regions 52 and the phase shifters 54 are essentially the same as the quartz 50.

Figure 1A:
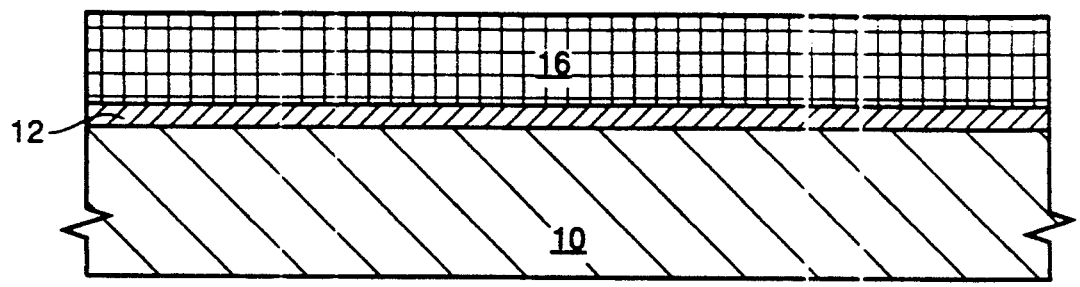
FIGS. 1A–1C are diagrammatic representations of the steps involved for forming chrome blockers on a quartz substrate.
Figure 1B:
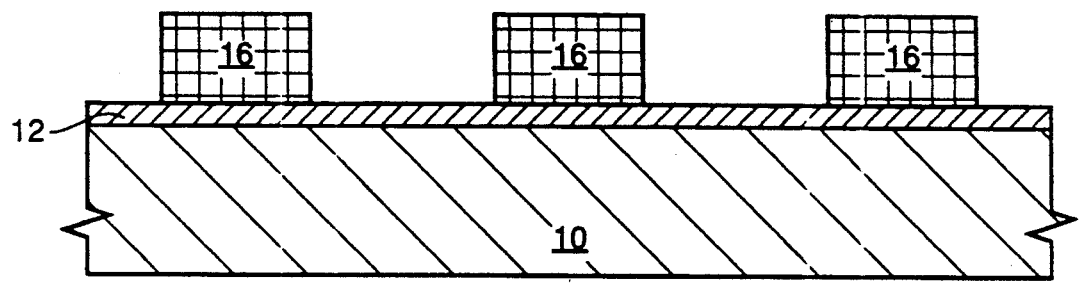
Figure 1C:
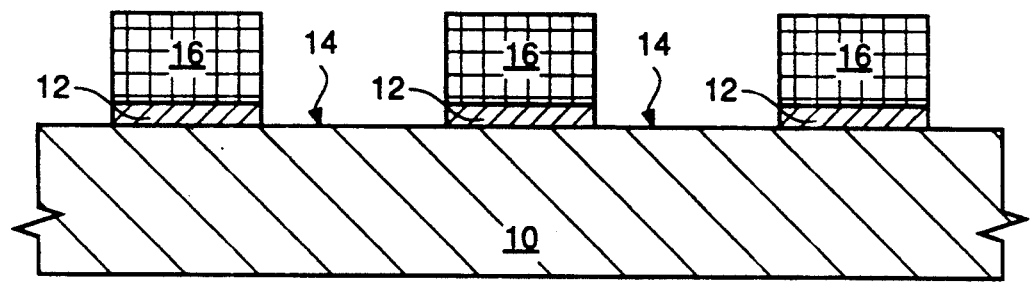
Figure 1D:
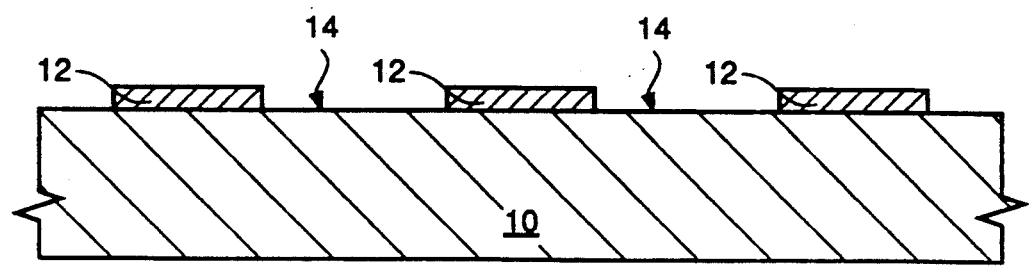
Figure 2A:
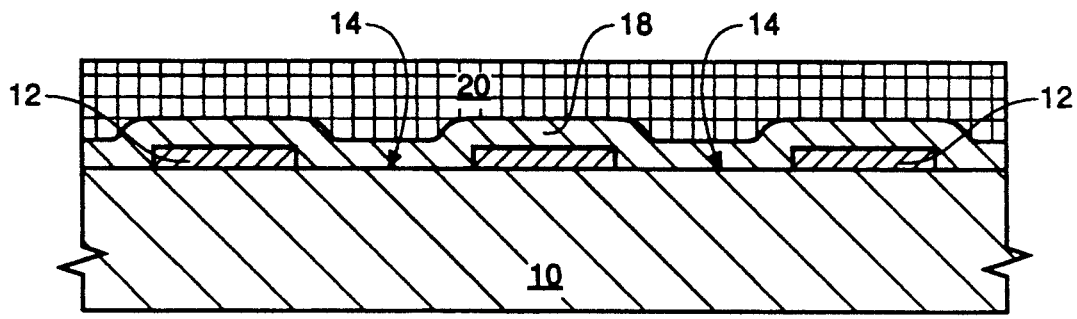
FIGS. 2A–2C are diagrammatic representations of the steps involved in fabricating a phase shift reticle in accordance with a prior art "lift-off process"
Figure 2B:
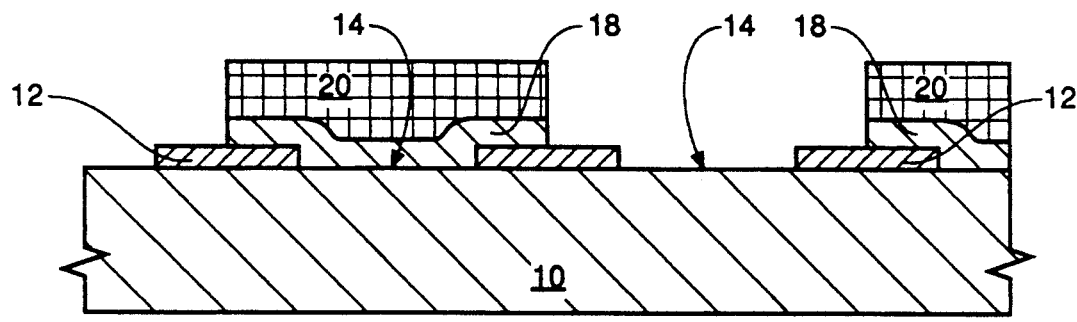
Figure 2C:
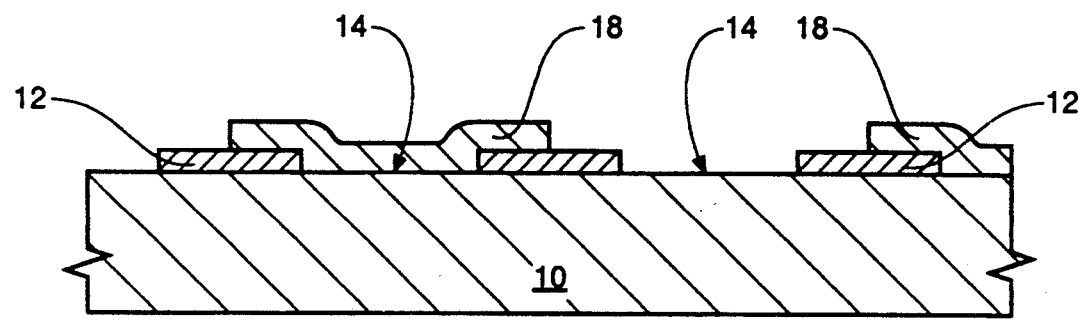
Figure 3A:
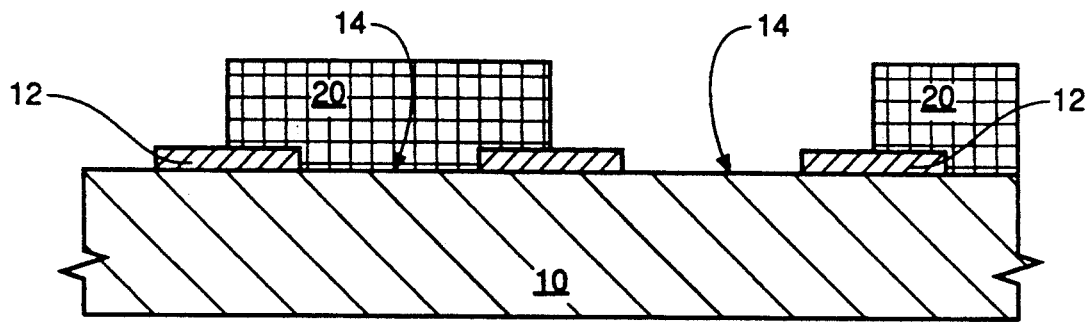
FIGS. 3A–3C are diagrammatic representations of the steps involved in fabricating a phase shift reticle in accordance with the prior art etch back process.
Figure 3B:
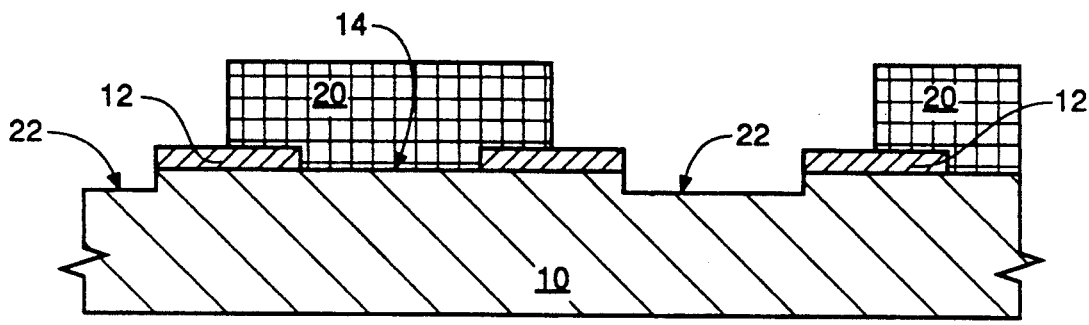
Figure 3C:
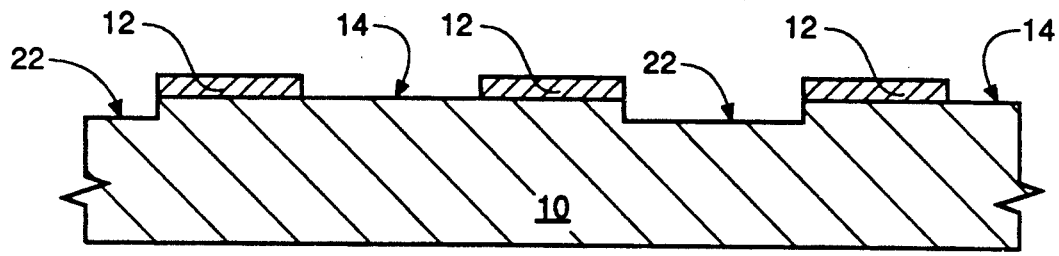
Figure 4:
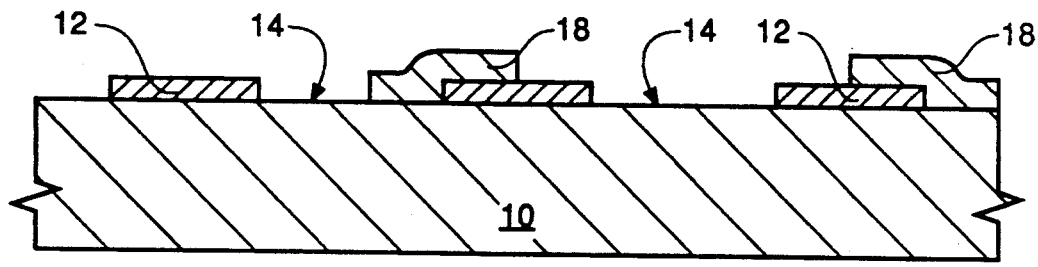
FIG. 4 is a diagrammatic representation of a phase shift reticle in accordance with the prior art showing an abrupt transition from a phase shifted to a non-phase shifted region.

Additionally, another feature of the invention is that it is possible to gradually transition the phase shifter 54 from a phase shift region to a non-phase shifted reference transmission region. When applying several of the phase shift masking techniques, there are many cases where it is desirable to terminate a phase shifted region preceding to a non-phase shifted regions with the border being over a transmissive area (ie non-opaque). In the prior art and referring now to FIG. 4, a problem occurs where a sharp transition from a phase shifted to a non-phase shifted region creates a null in the electric field and thus in the intensity of the radiation, leaving a possible undesirable narrow line in positive resist and a narrow space in negative resist. In many applications it would be advantageous to have this border over clear regions and not leave these spurious features.

Figure 6:
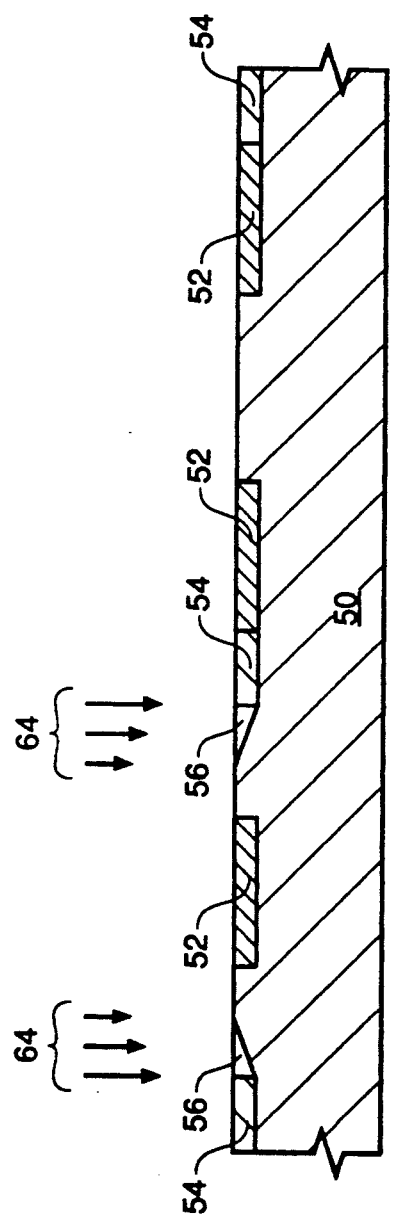
FIG. 6 is a diagrammatic representation of the steps involved in fabricating the phase shift reticle of FIGS. 5A and 5B including fabricating a gradual transition from a phase shifted to a non-phase shifted region.

One means to achieve this is by tapering or grading the transition from full phase shift regions to no-phase shift regions as shown in FIG. 6. For example, for a case where the phase shifted region is 180° out of phase with the non-phase shifted regions, it would be desirable to slope the phase shift 56 from 180° to 0° gently over a suitable distance of say 0.5 to 2 m's. This can be done using the method of the present invention as shown in FIG. 6. With this grading approach, the spurious features mentioned above can be avoided at phase shift termination boarders. An example of the practical application of this flexibility is with the use of the Alternating Aperture approach. The Alternating Aperture approach, commonly used in phase shift mask applications, requires use of negative photo resist with conventional means to avoid having to terminate phase shifting regions over clear areas. The installed base of photolithographic processes and fabricators throughout the world use positive resist and thus it is highly preferred due to its greater level of maturity, proven track record, and lack of disruption, risk, and capital cost of having to use negative photo resist photolithographic processes. Thus, and still referring to FIG. 6, the present invention enables one to form an alternating pattern of light transmission openings through quartz substrate 50 and ion implant phase shifters 54. Opaque light blocker sections 52 are located on either side of each ion implant phase shifter 54 and on either side of each light transmission opening through quartz substrate 50. This repetitive pattern can be described as a light blocker section 52, a phase shifter 54, a light blocker section 52, and a light transmission opening through quartz substrate 50. This is the completed reticle. The width of the opaque light blocker sections 52, phase shifters 54, and light transmission openings may be selected as required.

Thus the invention provides a simple yet unobvious method of fabricating phase shift mask or reticles suitably adapted for use in semiconductor photolithographics processes. The ion implantation step of the invention can be accurately controlled to achieve the opaque sections 52, 180° phase shifts in each of the phase shifters 54 or the gradual transition from 180° phase shift to 0° phase shift in the transition implantation 56. Moreover, there is no edge effect caused by uneven phase shifter thickness, and each phase shifter may be formed with a smooth optically perfect surface. Additionally, the process is clean and can be economically accomplished using equipment and techniques that are known in the art.

In the illustrated embodiment of the invention, the reticle included a simple pattern of lines and spaces. The method of invention, however, can be used to fabricate reticles in other patterns including, for example, wiring patterns, word lines, bit lines, whole lines, and black patterns. Further, the application of this invention is not limited to semiconductor lithography alone but may be utilized in applications requiring the tooling of fine-line masks or reticles.

While the process of the invention has been described with reference to a preferred embodiment thereof, it will be apparent to those skilled in the art, certain changes and modifications can be made without departing from the scope of the invention as defined by the following claims.

We claim:

1. A method of forming a phase shifting reticle comprising:
    forming a pattern of ion implant areas on a transparent substrate by ion bombardment of the substrate with an ion dopant selected to change an absorption property of the substrate and form opaque light blockers;
    forming a second pattern of ion implant areas on the substrate by ion bombardment of the substrate with an ion dopant selected to change an index of refraction of the substrate to form phase shifters for producing a phase shift of light; and
    forming a third pattern of light transmission areas on the substrate aligned with respect to the first and second patterns such that light passed through the phase shifters is phase shifted relative to light passed through the light transmission areas for improving an image defined by the opaque light blockers during photopatterning.

2. The method as recited in claim 1 further including positioning the first and second patterns in the substrate in a repetitive self aligned pattern to form opaque light blockers having alternating phase shifters and light transmission areas therebetween.

3. The method as recited in claim 1 and wherein:
    the phase shifters are ion implanted with an ion dopant to change the index of refraction of the substrate in the second pattern of ion implant areas to achieve a 180° phase shift.

4. The method as recited in claim 2 and further including ion bombardment of a portion of a light transmissive area adjacent a phase shifter area for forming a graduated phase shift from the phase shift of the phase shift area to no phase shift in the light transmissive area.

5. The method as recited in claim 4 and wherein:
    the graduated phase shift is from 180° adjacent the phase shift area to 0° extending into the light transmissive area.

6. The method as recited in claim 1 and wherein:
    ion implantation is by ion bombardment with electrostatic beam scanning.

7. The method as recited in claim 6 and wherein:
    ion bombardment is of single ion type.

8. The method as recited in claim 6 and wherein:
    ion bombardment utilizes a cluster beam source.

9. The method as recited in claim 1 and wherein:
    the ion dopant selected to form opaque light blockers is a species selected from a class including species of Nitrogen, Tungsten and Chrome.

10. The method as recited in claim 1 and wherein:
    the ion dopant selected to form phase shifters is a species selected from a class including species of Boron And Phosphorous.

11. A method of forming a reticle for use in semiconductor photolithography comprising:
    forming a pattern of ion implant areas on a transparent substrate by ion bombardment of the substrate with an ion dopant selected to change an absorption property of the substrate and form opaque light blockers in the substrate in a repetitive pattern to define an image for photopatterning with the opaque light blockers having light transmissive areas therebetween; and
    forming a second pattern of ion implant areas on the substrate by ion bombardment with an ion dopant selected to change an index of refraction of the substrate to form phase shifters for producing a phase shift of light with the phase shifters and light transmissive areas aligned with respect to the opaque light blockers to cancel light diffracted from the opaque light blockers and improve a projected image during photopatterning.

12. The method as recited in claim 11 and wherein:

ion implantation is by ion bombardment with electrostatic beam scanning.

13. The method as recited in claim 12 and wherein: ion bombardment is of single ion type.

14. The method as recited in claim 12 and wherein: ion bombardment utilizes a cluster beam source.

15. The method as recited in claim 11 and wherein: the ion dopant selected to form opaque light blockers is a species selected from a class including species of Nitrogen, Tungsten and Chrome.

16. The method as recited in claim 11 further including:
ion implanting a second ion dopant in alternate light transmissive openings, the second dopant selected and concentrated to change the index of refraction of the substrate to provide a 180° phase shift.

17. The method as recited in claim 16 and wherein: the substrate is quartz(QZ).

18. The method as recited in claim 16 and wherein: the ion dopant selected to form phase shifters is a species selected from a class including species of Boron And Phosphorous.

19. The method as recited in claim 11 and further including ion bombardment of a portion of a light transmissive area adjacent a phase shifter area for forming a graduated phase shift.

20. The method as recited in claim 19 and wherein the graduated phase shift is from 180° adjacent the phase shift area to 0° extending into the light transmissive area.

* * * * *